(12) United States Patent
Tang et al.

(10) Patent No.: US 11,906,355 B1
(45) Date of Patent: Feb. 20, 2024

(54) IN-CELL OPTICAL SENSING DISPLAY PANEL

(71) Applicant: Novatek Microelectronics Corp., Hsinchu (TW)

(72) Inventors: Yu-Ying Tang, Taoyuan (TW); Yao Chung Chang, Taichung (TW); Chih-Chang Lai, Taichung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 18/162,687

(22) Filed: Jan. 31, 2023

(51) Int. Cl.
| | |
|---|---|
| *G06V 40/13* | (2022.01) |
| *G06F 3/041* | (2006.01) |
| *G01J 1/44* | (2006.01) |
| *G01J 1/42* | (2006.01) |
| *H10K 39/34* | (2023.01) |
| *G02F 1/1333* | (2006.01) |
| *G02F 1/1335* | (2006.01) |
| *H10K 59/80* | (2023.01) |
| *H10K 59/125* | (2023.01) |

(52) U.S. Cl.
CPC ............... *G01J 1/44* (2013.01); *G01J 1/4204* (2013.01); *G02F 1/13338* (2013.01); *G02F 1/133512* (2013.01); *G06F 3/0412* (2013.01); *G06V 40/1318* (2022.01); *H10K 39/34* (2023.02); *H10K 59/8792* (2023.02); *G01J 2001/446* (2013.01); *G01J 2001/448* (2013.01); *H10K 59/125* (2023.02)

(58) Field of Classification Search
CPC ....... G01J 1/44; G06V 40/1318; G03F 3/0412
USPC ................................... 345/173, 174
See application file for complete search history.

(56) References Cited

U.S. PATENT DOCUMENTS

2013/0272586 A1\* 10/2013 Russo ................... G06V 40/12
382/124
2016/0050378 A1 2/2016 Wu et al.

FOREIGN PATENT DOCUMENTS

CN 105373764 3/2016

\* cited by examiner

*Primary Examiner* — Calvin C Ma
(74) *Attorney, Agent, or Firm* — JCIPRNET (57) ABSTRACT

An in-cell optical sensing display panel includes a pixel array, a plurality of first optical sensors and a plurality of second optical sensors. The pixel array is disposed in an active area of the in-cell optical sensing display panel, and the active area includes a first region and a second region which surrounds the first region. The sensor array is disposed in the first region of the active area and is configured to sense a fingerprint of a finger touching a surface of the in-cell optical sensing display panel. The second optical sensors are disposed in the second region of the active area and are configured to sense ambient light, and the second optical sensors are not to be used for fingerprint sensing.

12 Claims, 9 Drawing Sheets

IN-CELL OPTICAL SENSING DISPLAY PANEL

BACKGROUND

Technical Field

The disclosure generally relates to a display panel, and more particularly, to an in-cell optical sensing display panel having a fingerprint sensor and an ambient light sensor.

Description of Related Art

As technology advances, a display panel is integrated with a number of different functions such as displaying function, a touch sensing function, a fingerprint sensing function and an ambient light sensing function. The fingerprint sensing function may be achieved by using fingerprint sensors to sense peaks and valleys of a user's finger, and the ambient light sensing function may be achieved by using ambient light sensors to sense light intensity of the surrounding environment. Even though both the fingerprint sensors and the ambient light sensors may use photosensitive elements to sense light, design requirements and operations of the fingerprint sensors and the ambient light sensors are significantly different. For example, in the fingerprint sensing operation, a light source must illuminate light toward the user's finger such that the fingerprint sensors sense a reflected light from the user's finger to generate a fingerprint image. In the ambient light sensing operation, the ambient light sensors simply sense the intensity of light from the surrounding environment. The differences in design requirements and operations of the fingerprint sensors and the ambient light sensors result in many problems in the display panel that integrates both the fingerprint sensors and the ambient light sensors.

A major problem is regarding to display panel size. If the sensors (fingerprint sensors and/or ambient light sensors) are disposed in a non-active area of the display panel, a size of the display panel is increased. As a demand for compact and high-quality display panels, it is desirable to have an innovative design of the display panel having the fingerprint sensing function and the ambient light sensing function. Nothing herein should be construed as an admission of knowledge in the prior art of any portion of the present disclosure.

SUMMARY

In an embodiment, an in-cell optical sensing display panel includes a pixel array, a sensor array and a plurality of second optical sensors, wherein the sensor array includes a plurality of first optical sensors. The pixel array is disposed in an active area of the in-cell optical sensing display panel, and the active area includes a first region and a second region which surrounds the first region. The sensor array is disposed in the first region of the active area and is configured to sense a fingerprint of a finger touching a surface of the in-cell optical sensing display panel. The second optical sensors are disposed in the second region of the active area and are configured to sense ambient light, and the second optical sensors are not to be used for fingerprint sensing.

In an embodiment, each of the second optical sensors comprises a plurality of sensing elements, and an occupied area of each of the plurality of sensing elements is same as an occupied area of one of the first optical sensors.

In an embodiment, the sensing elements are divided into a plurality of sensing groups electrically connected to each other in parallel, and sensing elements in each of the sensing groups are electrically connected to each other in series.

In an embodiment, the in-cell optical sensing display panel further includes a non-active area where no display pixel is disposed and no second optical sensor is disposed.

In an embodiment, the in-cell optical sensing display panel further includes an optical sensing layer and a black matrix layer. The optical sensing layer includes the first optical sensors and the second optical sensors. The black matrix layer includes a plurality of first openings and a plurality of second openings. Each of the first openings corresponds to a corresponding one of the first optical sensors and overlaps an area of the corresponding one of the first optical sensors. Each of the second openings corresponds to a corresponding one of the second optical sensors and overlaps an area of the corresponding one of the second optical sensors, and a width of each of the second openings is greater than a width of each of the first openings.

In an embodiment, a horizontal distance between a central point of each of the second openings and a central point of the area of the corresponding one of the second optical sensors is greater than a horizontal distance between a central point of the each of the first openings and a central point of the area of the corresponding one of the first optical sensors.

In an embodiment, a position of each of the second openings is relative to a position of each of the corresponding one of the second optical sensors, such that a field of view of the corresponding one of the second optical sensors is inclined toward an edge of the in-cell optical sensing display panel.

In an embodiment, the touch sensing layer further includes a plurality of third openings and a plurality of fourth openings, wherein the third openings overlap the first openings, and the fourth openings overlap the second openings. A width of each of the fourth openings is greater than a width of each of the third openings.

In an embodiment, a horizontal distance between a central point of each of the fourth openings and a central point of the area of the corresponding one of the second optical sensors is greater than a horizontal distance between a central point of the each of the third openings and a central point of the area of the corresponding one of the first optical sensors.

In an embodiment, a position of each of the fourth opening is relative to a position of each of the corresponding one of the second optical sensors, such that a field of view of the corresponding one of the second optical sensors is inclined toward an edge of the in-cell optical sensing display panel.

In an embodiment, the in-cell optical sensing display panel is a liquid crystal display (LCD) panel. In an alternative embodiment, the in-cell optical sensing display panel is an organic light-emitting diode (OLED) panel.

In summary, the in-cell optical sensing display panel may include a plurality of first optical sensors and a plurality of second sensors, in which the first optical sensors are configured to sense a fingerprint, and the second optical sensors are configured to sense ambient light. Both of the first optical sensors and the second optical sensors are disposed in an active area of the in-cell optical sensing display panel. Thus, a glass utilization rate of the in-cell optical sensing display panel is high and a bezel width of the in-cell optical sensing display panel is reduced. In addition, the in-cell optical sensing display panel is designed such that a field of view (FOV) of the second optical sensors are inclined toward an edge of the in-cell optical sensing display panel. In this way, the second optical sensors may sense the ambient light more efficiently, and an interference of operations of the in-cell optical sensing display panel to the ambient light sensing operation is reduced. Furthermore, each of the second optical sensors may include a plurality of sensing elements, and an occupied area of each of the plurality of sensing elements is same as an occupied area of one of the first optical sensors. The sensing elements are divided into a plurality of sensing groups electrically connected to each other in parallel, and sensing elements in each of the sensing groups are electrically connected to each other in series. In this way, a same manufacturing processes may be applied to produce both of the first optical sensors and the second optical sensors of the in-cell optical sensing display panel, resulting in low manufacturing cost and high manufacturing efficiency.

To make the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

It is to be understood that other embodiments may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
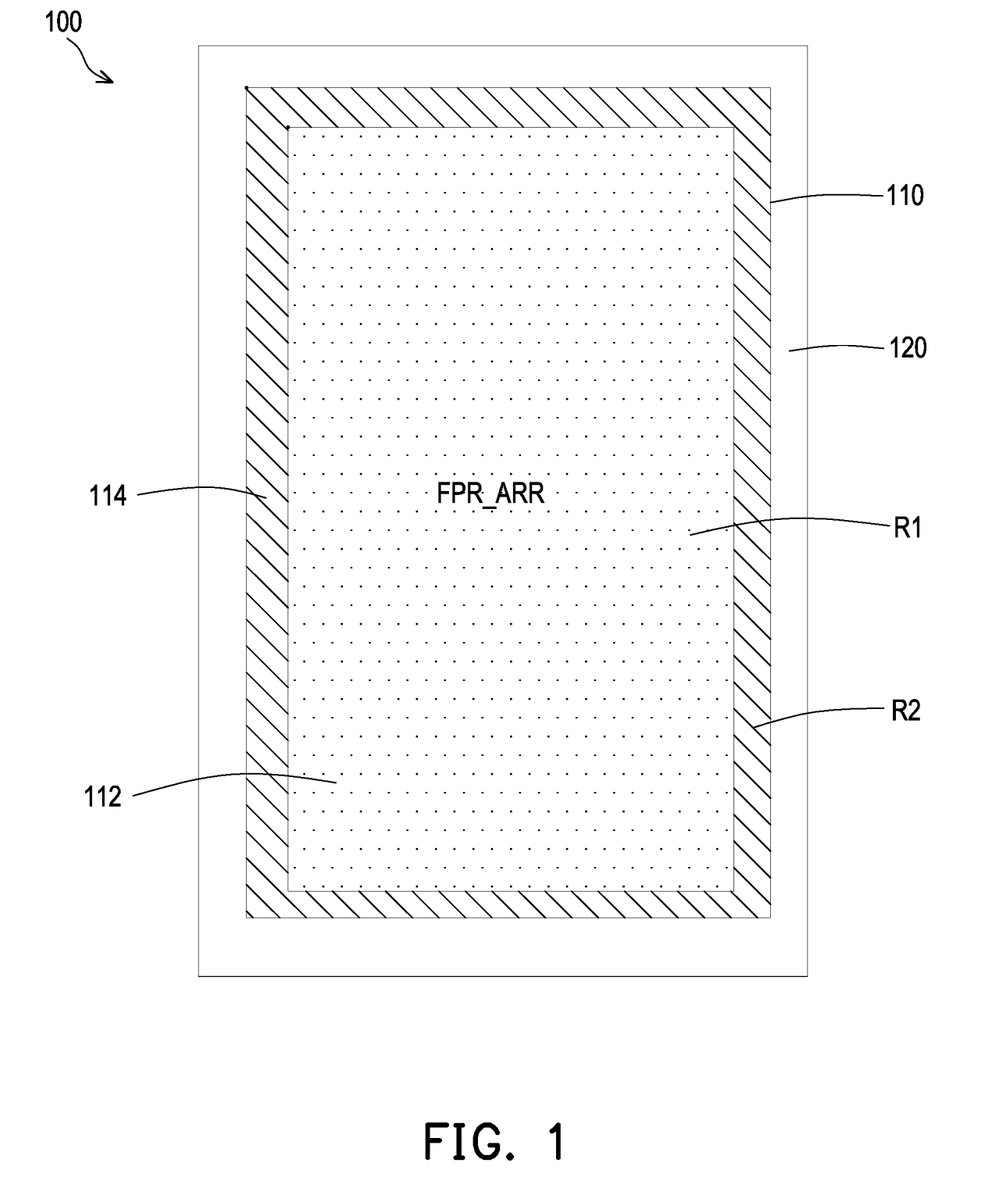
FIG. 1 illustrates a schematic diagram of an in-cell optical sensing display panel in accordance with an embodiment.

FIG. 1 illustrates a schematic diagram of a display panel 100 in accordance with an embodiment. The display panel 100 may be an in-cell optical sensing display panel 100 which has at least one of a display function, a touch sensing function, a fingerprint sensing function and an ambient light sensing function. The display panel 100 may include a plurality of display pixels (not shown) for the display function and a plurality of touch sensors (not shown) for the touch sensing function. The touch sensors may be embedded in the display panel 100. The display panel 100 includes an active area 110 and a non-active area 120 that surrounds the active area 110. The active area 110 includes a plurality of display pixels arranged in an array, which are active for display function, and the non-active area 120 does not display no matter there is no display pixel or there are display pixels in the non-active area 120. The active area 110 may include a first region R1 located at a central region of the display panel 100 and a second region R2 that surrounds the first region R1. The second region R2 is sandwiched between the first region R1 and the non-active area 120. The second region R2 may be divided into four regions including a top region, a bottom region, a left region and a right region that respectively located to a top edge, a bottom edge, a left edge and a right edge of the display panel 100.

In an embodiment, a plurality of fingerprint sensors 112 for performing the fingerprint sensing function and a plurality of ambient light sensors (ALSs) 114 for performing the ambient light sensing function are disposed within the active area 110 of the display panel 100. The fingerprint sensors 112 are disposed in the first region R1 and the ambient light sensors 114 are disposed in the second region R2. The fingerprint sensors 112 and the ambient light sensors 114 may be optical sensors that include photosensitive elements for sensing light.

The fingerprint sensors 112 (also referred to as first optical sensors) are formed as a sensor array, denoted by FPR ARR, arranged in rows and columns. The fingerprint sensors 112 are configured to sense a reflected light from a finger of a user touching a surface of the display panel 100, to generate fingerprint sensing signals.

The ALSs 114 are configured to sense ambient light from surrounding environment of the display panel 100, and the ALSs 114 are not configured to sense fingerprint of the user. The ALSs 114 may be disposed in at least one of the four regions (the top region, the bottom region, the left region and the right region) of the second region R2 in the active area 110. The disclosure does not intend to limit the positions of the ambient light sensors 114, and the positions of the ambient light sensors 114 may be determined according to design requirements.

Circuits of the fingerprint sensors 112 and the ambient light sensors 114 and circuits of the display pixels of the active area 110 are implemented in same structural layers. Each display pixel in the active area 110 may be referred to as a full-color display pixel that includes red, green and blue subpixels. One or more full-color display pixels in the first region R1 of the active area 110 may correspond to one fingerprint sensor 112. In an embodiment, the number of the fingerprint sensors 112 in the display panel 100 is determined based on the required resolution of fingerprint sensing. For a higher fingerprint image resolution, each of the fingerprint sensors 112 in the first region R1 of the active area 110 may be arranged next to a corresponding full-color display pixel in the first region R1 of the active area 110. For a lower fingerprint image resolution, each of the fingerprint sensors 112 in the first region R1 of the active area 110 may be arranged next to every two or more full-color display pixels in the first region R1 of the active area 110.

The number of the ALSs 114 in the second region R2 of the active area 110 of the display panel 100 is determined based on the required resolution of ambient light sensing. In one embodiment, each of the ALSs 114 in the second region R2 of the active area 110 may be arranged next to a corresponding full-color display pixel in the second region R2 of the active area 110. The sensing elements of the ALSs 114 may be disposed along one or more display pixel rows and/or one or more display pixel columns in the second region R2. The sensing elements of the ALSs 114 may be disposed along at least one of display pixel columns of the left region or the right region of the second region R2. The sensing elements of the ALS 114 may also be disposed along at least one of display pixel rows of the top region or the bottom region of the second region R2.

Figure 2A:
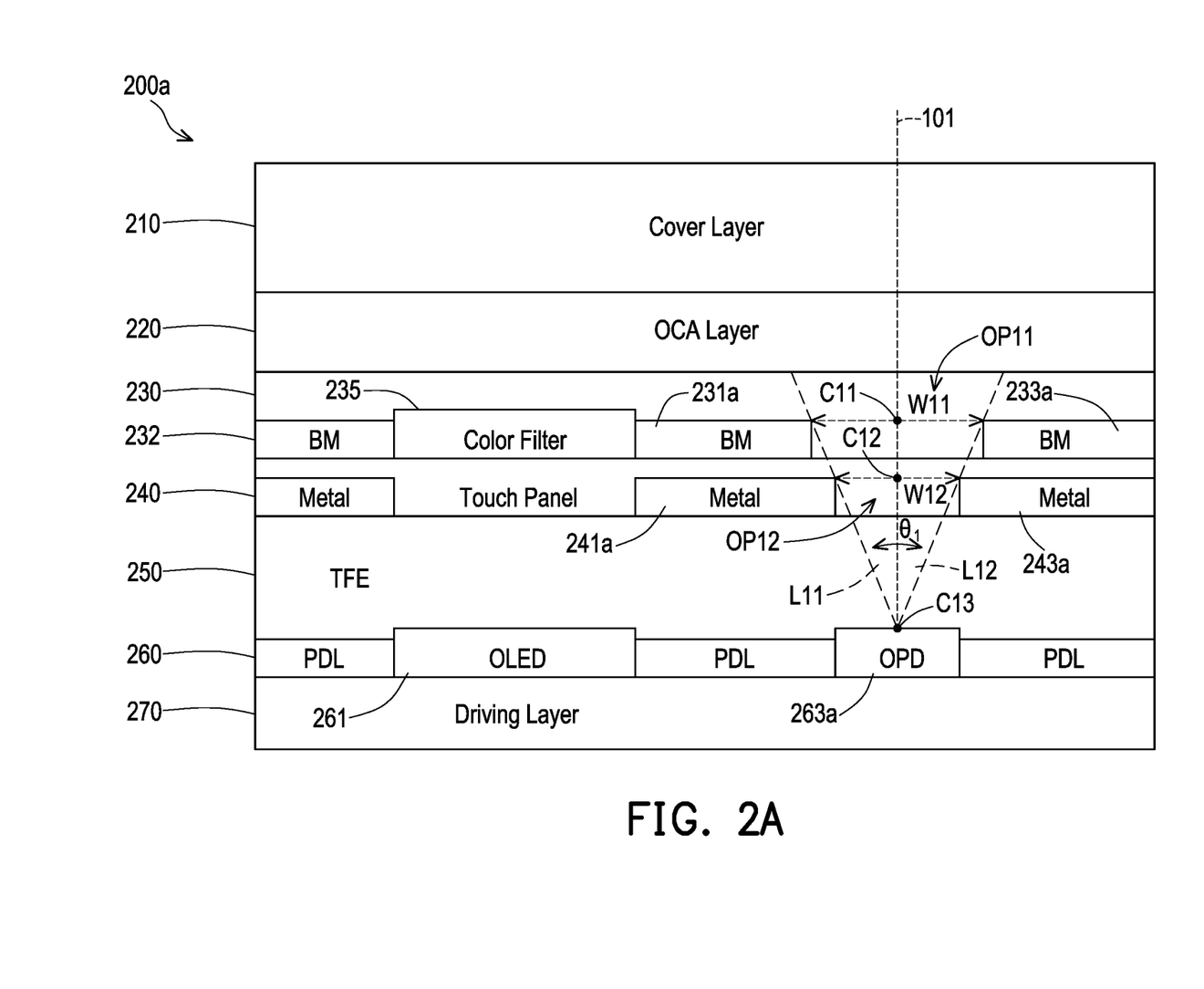
FIG. 2A illustrates a cross-sectional view of an OLED panel including a fingerprint sensor in accordance with an embodiment.

FIG. 2A illustrates a cross-sectional view of an OLED display panel 200a in accordance with an embodiment. The OLED panel 200a in FIG. 2A may be the display panel 100 in FIG. 1 in an embodiment. The OLED display panel 200a may include a cover layer 210, an optical clear adhesive (OCA) layer 220, a color filter layer 230, a touch sensing layer 240, a thin film encapsulation (TFE) layer 250, an optical sensing layer 260 and a driving layer 270. The optical sensing layer 260, in view of panel structure, is also regarded as a self-illuminating layer where OLED elements are disposed. In other words, OLED material and organic photodiode (or the like) as the optical sensing layer 260 may be formed in the same layer. The self-illuminating layer includes a plurality of OLED elements 261 as display subpixels. The driving layer 270 is a circuit layer formed on a substrate, which may be a glass substrate or a flexible substrate. The cover layer 210 is designed to provide protection to the OLED display panel 200a. The cover layer 210 may be constructed of flexible or non-flexible glass, flexible or non-flexible plastic or any other suitable material. A thickness and stiffness of the cover layer 210 are determined according to design requirements. The optical clear adhesive (OCA) layer 220 is sandwiched between the cover layer 210 and the color filter layer 230 for bonding the cover layer 210 to the color filter layer 230. A thickness and material of the OCA layer 220 may set according to design requirements.

The color filter layer 230 may include a black matrix (BM) layer 232 that has a plurality of BM regions, a color filter region 235, and an opening OP11 (also referred to as a first opening). The color filter region 235 is formed between two of the BM regions, and the opening OP11 is formed between two of the BM regions. As shown in FIG. 2A, the opening OP11 is formed between BM regions 231a and 233a of the BM layer 232, and an opening OP12 is formed between two metal electrodes 241a and 243a of the touch sensing layer 240. The size of the opening OP11 is similar to the size of the opening OP12. The BM regions of the BM layer 232 may be made of light shielding materials that are designed to shield light passing through the BM regions and to separate red, green and blue color filters. In an embodiment, the color filter region 235 corresponds to an OLED element 261 of the OLED display panel 200a, and the color filter region 235 may partially or completely overlap the OLED element 261 that are disposed beneath the color filter region 235. In an embodiment, the opening OP11 is designed to allow light reflected from a finger touching a surface of the OLED display panel 200a to pass through the opening OP11 to the fingerprint sensor 263a disposed beneath the opening OP11. The opening OP11 has a width W11 and a central point C11 which are set by appropriately setting positions of the BM regions 231a and 233a. Changes of width W11 and the central point C11 of the opening OP11 may results in a change in a field of view (FOV) $\theta_1$ of the fingerprint sensor 263a. For example, the FOV $\theta_1$ of the fingerprint sensor 263a may be larger as the width W11 of the opening OP11 is larger, and vice versa. In FIG. 2A, the FOV $\theta_1$ of the fingerprint sensor 263a refers to angle between light rays L11 and L12 that can be captured by the fingerprint sensor 263a. In an embodiment, the BM layer 232 further include an opening (shown in FIG. 2B) that partially or completely overlap an ambient light sensor (263b shown in FIG. 2B) disposed beneath the openings (OP21 and OP22 shown in FIG. 2B).

Figure 2B:
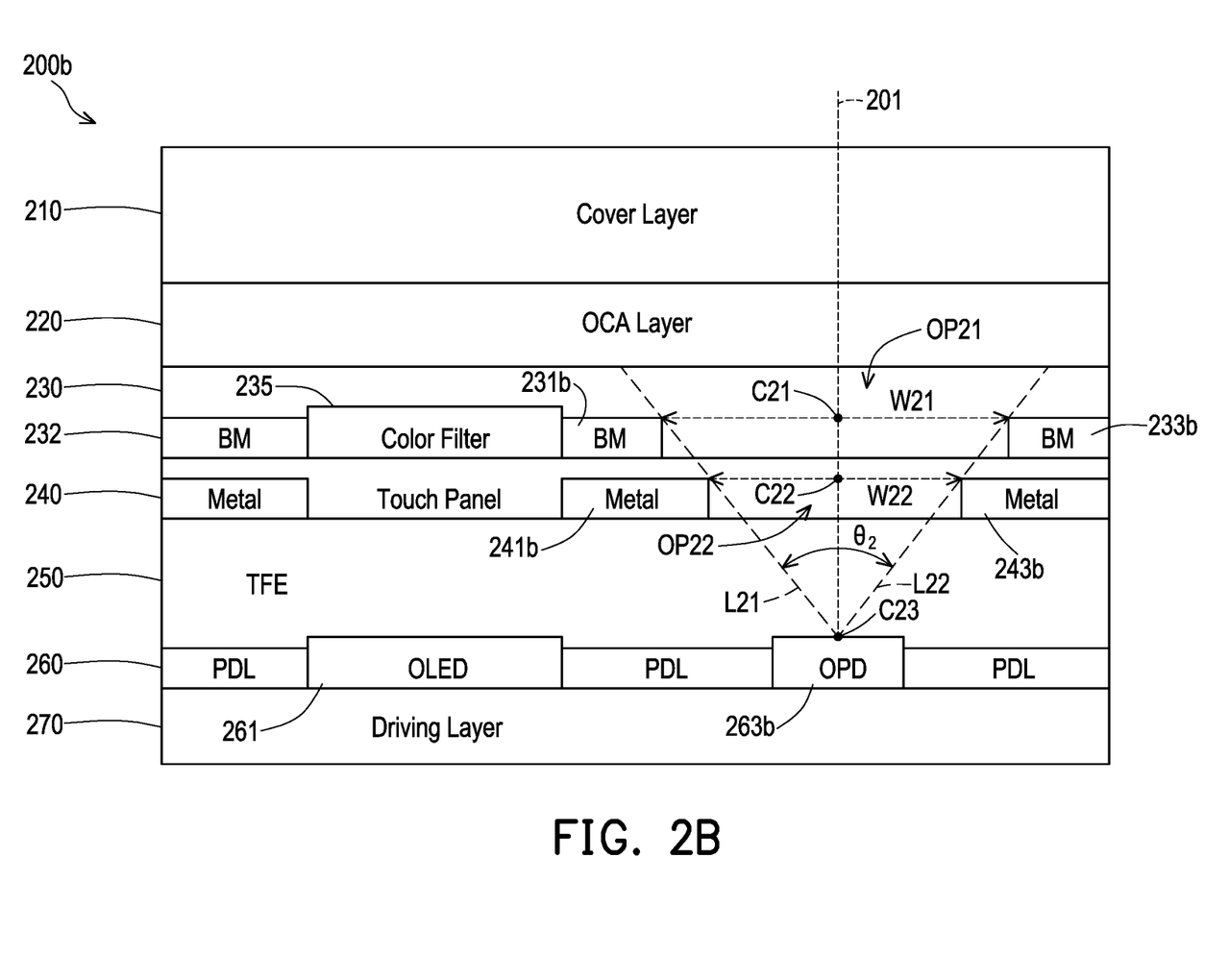
FIG. 2B illustrates a cross-sectional view of an OLED panel including an ambient light sensor in accordance with an embodiment.

The touch sensing layer 240 may include a plurality of metal electrodes such as two metal electrodes 241a and 243a in FIG. 2B and an opening OP12 (also referred to a third opening) that is formed between two metal electrodes 241a and 243a. In an embodiment, the metal electrodes of the touch sensing layer 240 are designed to sense a touch of a user finger on the surface of the OLED display panel 200a. The opening OP12 may have a width W12 and a central portion C12, in which the width W12 and the central point C12 of the opening OP12 depend on to positions of metal electrodes 241a and 243a. The opening OP12 of the touch sensing layer 240 may partially or completely overlap the opening OP11 of the color filter layer 230, such that the light reflected from the finger touching the surface of the OLED display panel 200a may pass through the openings OP11 and OP12 to the fingerprint sensor 263a disposed beneath the opening OP11 and OP12. Changes of the width W12 and the central point C12 of the opening OP12 may result in a change of the FOV $\theta_1$ of the fingerprint sensor 263a disposed beneath the openings OP12. Additionally, positions of the central points C11 and C12 of the openings OP11 and OP12 in relative to a central point C13 of the fingerprint sensor 263a may also impact the FOV $\theta_1$ of the fingerprint sensor 263a. The central point C13 of the fingerprint sensor 263a refers to the central point of the area of the fingerprint sensor 263a on the optical sensing layer 260. The FOV $\theta_1$ of fingerprint sensor 263a may have a central axis 101 that divides the FOV $\theta_1$ into two equal angles. The central axis 101 of the FOV $\theta_1$ may go through the central point C13 of the fingerprint sensor 263a, the central point C11 of the opening OP11 and the central point C12 of the opening OP12. However, the disclosure is not limited thereto, and the central axis 101 of the FOV $\theta_1$ may not necessarily go through both of the central points C11 and C12 of the openings OP11 and OP12.

The fingerprint sensor 263a may include a photosensitive element such as an organic photodiode (OPD) element or organic thin film transistor (OTFT) or any other suitable elements. The photosensitive element of the fingerprint sensor 263a is configured to sense the reflected light from the finger which touches the surface of the OLED display panel 200a to the fingerprint sensor 263a through the openings OP11 and OP12. In an embodiment, the FOV $\theta_1$ of the fingerprint sensor 263a may depend on widths of the opening OP11 of the color filter layer 230 and the opening OP12 of the touch sensing layer 240. Additionally, the FOV $\theta_1$ of the fingerprint sensor 263a may also depend on the central positions C11 and C12 of the openings OP11 and OP11 in relative to the central position C13 of the fingerprint sensor 263a. In an embodiment, the optical sensing layer 260 further includes an ambient light sensor (shown in FIG. 2B) that are configured to sense ambient light of the surrounding environment of the OLED display panel 200a. The optical sensing layer 260 may also be referred to as pixeldefine layer (PDL). The PDL is patterned to leave space for OLED element and may be made of materials similar to materials of the black matrix layer.

The thin film encapsulation (TFE) layer 250 may be sandwiched between the optical sensing layer 260 and the touch sensing layer 240. The TFE layer 250 is configured to prevent oxygen and moisture from penetrating into the OLED element 261 and the fingerprint sensor 263*a* in the optical sensing layer 260. The driving layer 270 may include driving circuits or driving electrodes for driving the OLED element 261 and the fingerprint sensor 263*a* in the optical sensing layer 260.

FIG. 2B illustrates a cross-sectional view of an OLED display panel 200*b* including an ALS 263*b* in accordance with an embodiment. The OLED display panel 200*b* in FIG. 2B may be the display panel 100 in FIG. 1 in an embodiment. Same elements in FIG. 2A and FIG. 2B are illustrated by same reference numbers. In FIG. 2B, the ALS 263*b* may include a photosensitive element such as an OPD element or an OTFT element or any other suitable elements. The photosensitive element of the ALS 263*b* is configured to sense ambient light of the surrounding environment of the OLED display panel 200*b*. The ALS 263*b* may have a central point C23 and an FOV of $\theta_2$ which is an angle between the light rays L21 and L22. The color filter layer 230 includes an opening OP21 (also referred to a second opening) that is formed between the BM regions 231*b* and 233*b* of the BM layer 232 and an opening OP22 that is formed between the metal electrodes 241*b* and 243*b* of the touch sensing layer 240. In an embodiment, the FOV $\theta_2$ of the ALS 263*b* has a central axis 201 which divides the FOV $\theta_2$ into two equally angles. In an embodiment, the FOV $\theta_2$ of the ALS 263*b* depends on the designs (i.e., positions and widths) of the openings OP21 and OP22. For example, the FOV $\theta_2$ of the ALS 263*b* is larger than FOV $\theta_1$ of fingerprint sensor 263*a* in FIG. 2A as the widths W21 and W22 of the openings OP21 and OP22 are larger than the widths of the openings OP11 and OP12. In addition, the FOV $\theta_2$ of the ALS 263*b* may be inclined toward an edge of the OLED display panel 200*b* by appropriately setting the positions of the central points C21 and C22 and/or the widths W21 and W22 of the openings OP21 and OP22. The central axis 201 of the FOV $\theta_2$ goes through the central points C21 and C22 of the openings OP21 and OP22.

Referring to FIG. 2A and FIG. 2B, the ALS 263*b* is required to capture a wider range of light intensities than the fingerprint sensor 263*a*. As such, the ALS 263*b* may have a wider FOV than the fingerprint sensor 263*a*. In other words, the FOV $\theta_1$ of the fingerprint sensor 263*a* is less than the FOV $\theta_2$ of the ALS 263*b*. In an embodiment, the width W11 of the opening OP11 is less than the width W21 of the opening OP21, and the width W12 of the opening OP12 is less than the width W22 of the opening OP22.

In an embodiment, the display function and/or the fingerprint sensing operation of the OLED display panel 200*b* may interfere the ambient sensing operation of the ALS 263*b*. For example, the light emitted from the OLED display panel 200*b* when performing the display function may enter the ALS 263*b*, resulting in inaccurate reading of the ALS 263*b*. Additionally, in the fingerprint sensing operation, emitted light and the reflected light in the fingerprint sensing operation may enter the ALS 263*b*, resulting inaccurate reading of the ALS 263*b*.

In an embodiment, the FOV $\theta_2$ of the ALS 263*b* is inclined toward an edge of the OLED display panel 200*b* by appropriately setting the positions of the BM regions 231*b*, 233*b* and the positions of the metal electrodes 241*b* and 243*b*. When the FOV $\theta_2$ of the ALS 263*b* is inclined toward an edge of the OLED display panel 200*b*, interferences of the display operation and the fingerprint sensing operation to the ambient light sensing function is reduced, and the ALS 263*b* may capture and sense ambient light from surrounding environment more accurately and efficiently.

Figure 3:
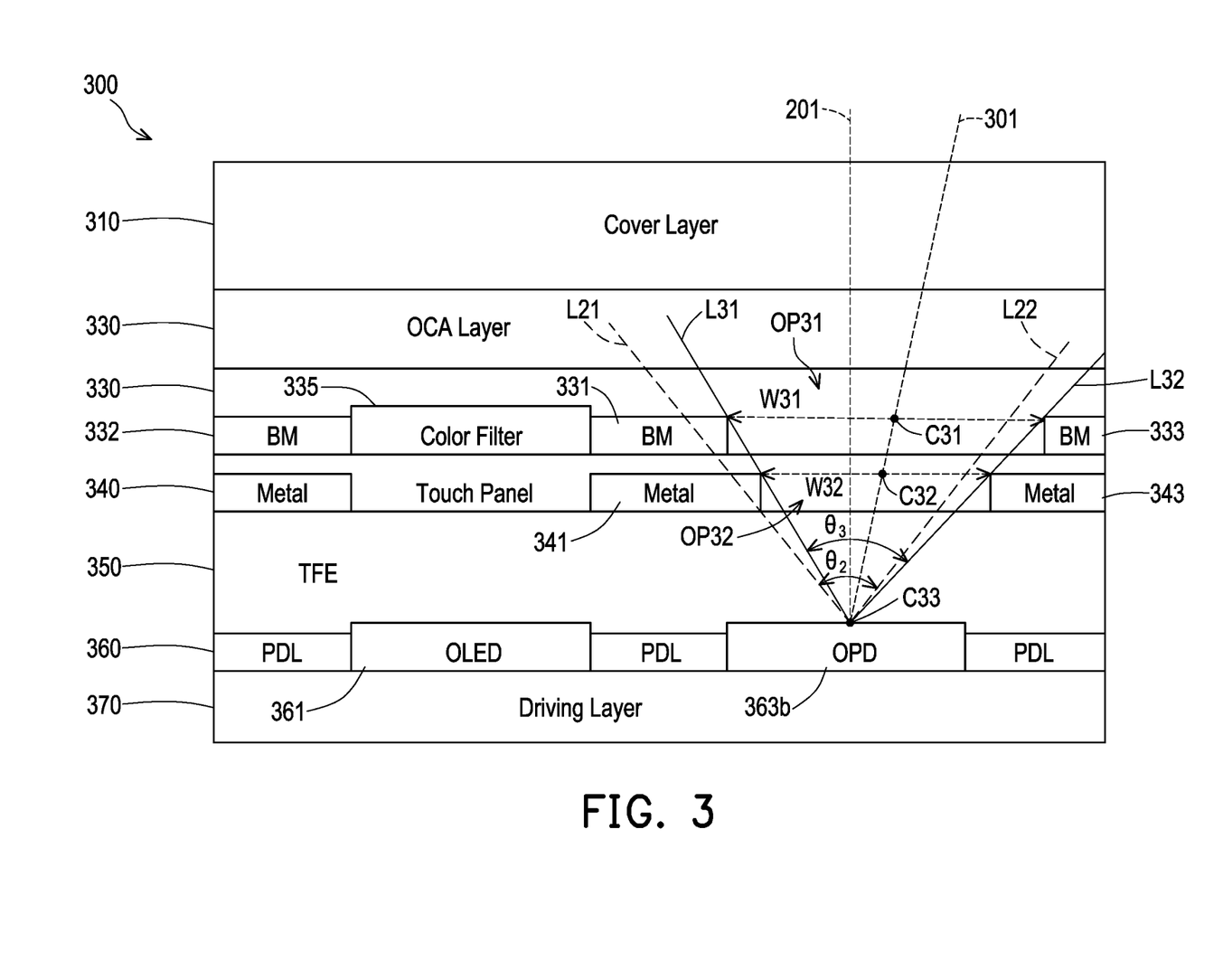
FIG. 3 and FIG. 4 illustrate an incline of an FOV of an ambient light sensor in an OLED panel in accordance with some embodiments.

FIG. 3 illustrates an incline of the FOV $\theta_3$ of the ALS 363*b* to an edge of an OLED display panel 300 in accordance with an embodiment. The elements 310 through 370, 335, 361 and 363*b* of the OLED display panel 300 in FIG. 3 are similar to elements 210 through 270, 235, 261 and 263*b* of the OLED display panel 200*b* in FIG. 2B, thus the detailed description of these elements in FIG. 3 is omitted hereafter. In FIG. 3, the color filter layer 330 includes an opening OP31 that is formed between BM regions 331 and 333 of the BM layer 333, and the touch sensing layer 340 includes an opening OP32 that is formed between the metal electrodes 341 and 343 of the touch sensing layer 340. The openings OP31 and OP32 have widths W31, W32 and central points C31 and C32, respectively. The FOV $\theta_2$ may refer to an angle between the light rays L21 and L22, and the FOV $\theta_3$ may refer to an angle between the light rays L31 and L32. The central axis 301 of the FOV $\theta_3$ may go through the central point C23 of the ALS 363*b* and the central points C31 and C32 of the openings OP31 and OP32. In the embodiment of FIG. 3, the FOV $\theta_3$ and the FOV $\theta_2$ may have the same absolute angle and have different inclining angles from the normal line perpendicular to the plane of the ALS.

In FIG. 3, the FOV of the ALS 363*b* is inclined toward an edge of the OLED display panel 300 (as the right-hand side of FIG. 3). In other words, the FOV of the ALS 363*b* is inclined outward from the center of the OLED display panel 300. The incline of the FOV of the ALS 363*b* from $\theta_2$ to $\theta_3$ may correspond to an incline of central axis of the FOV of the ALS 363*b* from the central axis 201 to the central axis 301. In an embodiment, the central axis of the FOV of the ALS 363*b* is inclined from the central axis 201 to the central axis 301 by shifting a position (or a central position) of at least one of the openings on the color filter layer 330 and the touch sensing layer 340.

In an embodiment, a position of the opening OP31 is set in relative to a position of the ALS 363*b* such that the FOV of the ALS 363*b* (or the central axis of the FOV of the ALS 363*b*) is inclined toward the edge of OLED display panel 300. For example, compared to the opening OP21 in the color filter layer 230 in FIG. 2B, the opening OP31 in the color filter layer 330 has a shift toward the edge of OLED display panel 300 relative to the opening OP21 shown in FIG. 2B, and the central point C33 has a shift toward the edge of OLED display panel 300 relative to the central point C23 shown in FIG. 2B. The shift of the opening OP31 in the color filter layer 330 may be performed by appropriately setting positions of the BM regions 331 and 333 of the BM layer 332, such that the FOV of the ALS 363*b* (or the central axis of the FOV of the ALS 363*b*) is inclined toward the edge of OLED display panel 300. The shift of the opening OP32 in the touch sensing layer 340 may be performed by appropriately setting positions of the metal electrodes 341 and 343 in the touch sensing layer 340.

Referring to FIG. 3 and FIG. 2A, as a result of the FOV incline of the ALS 363*b*, a horizontal distance between the central point C31 of the opening OP31 and the central point C33 of the area of the fingerprint sensor 363*b* is greater than a horizontal distance between a central point C11 of the opening OP11 and the central point C13 of the area of the corresponding to the fingerprint sensor 263*a*. Similarly, a horizontal distance between the central point C32 of the opening OP32 and the central point C33 of the area of the fingerprint sensor 336b is greater than a horizontal distance between a central point C12 of the opening OP12 and the central point C13 of the area of the corresponding to the fingerprint sensor 263a.

By appropriately setting the positions of the BM regions 331 and 333 in the BM layer 332 and appropriately setting the positions of the metal electrodes 341 and 343 in the touch sensing layer 340, it is possible to incline the FOV of the ALS 363b from $\theta_2$ to $\theta_3$ and to incline the central axis 201 of the FOV $\theta_2$ to the central axis 301 of the FOV $\theta_3$. As such, the FOV of the ALS 363b may be inclined toward a desired direction.

It is appreciated that an incline direction and an incline amount of the FOV of the ALS are determined according to design requirements. Additionally, the disclosure does not intend to limit the opening to be shifted. For example, both the openings OP21 and OP22 are shifted to be openings OP31 and OP32 in an embodiment; and only one of the openings OP21 and OP22 is shifted in an alternative embodiment. Based on that the FOV $\theta_3$ and the FOV $\theta_2$ may have the same absolute angle, the width W31 may be larger than the width W21. In another embodiment, if the width W31 is kept same as the width W21 and the inclining FOV $\theta_3$ is achieved by inclining the central axis 301 of the FOV $\theta_3$, the FOV $\theta_3$ in FIG. 3 may be smaller than the FOV $\theta_2$ in FIG. 2B. In still another embodiment, if the width W31 is kept same as the width W21, the inclining FOV $\theta_3$ may be achieved by shifting the opening OP31 and OP32.

Figure 4:
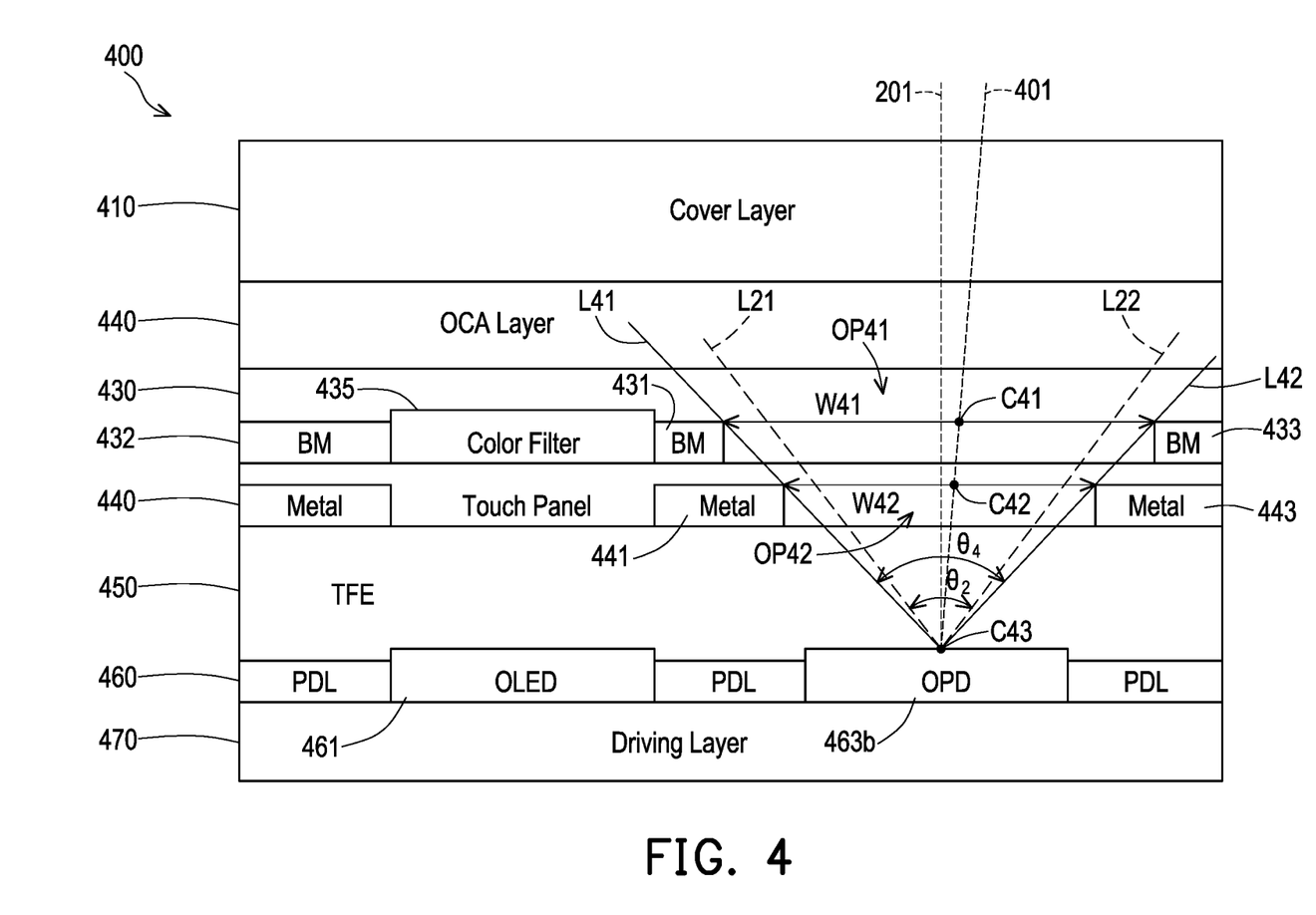

FIG. 4 illustrates an incline of the FOV $\theta_4$ of the ALS 463b to an edge of an OLED display panel 400 in accordance with an embodiment. The elements 410 through 470, 435, 461 and 463b of the OLED display panel 400 in FIG. 4 are similar to elements 210 through 270, 235, 261 and 263b of the OLED display panel 200b in FIG. 2B, thus the detailed description of these elements in FIG. 4 is omitted hereafter. The FOV $\theta_4$ may refer to an angle between the light rays L41 and L42. In FIG. 4, the color filter layer 430 includes an opening OP41 that is formed between BM regions 431 and 433 of the BM layer 432, and the touch sensing layer 440 includes an opening OP42 that is formed between the metal electrodes 441 and 443 of the touch sensing layer 440. The opening OP41 of the color filter layer 430 has a central point C41 and a width W41, and the opening OP42 of the touch sensing layer 440 has a central point C42 and a width W42. The central point C41 of the opening OP41 may be shifted relative to the central point C21 of the opening OP21 in FIG. 2B, the central point C42 of the opening OP42 may be shifted in relative to the central point C22 of the opening OP22 in FIG. 2B, and a central axis 401 of the FOV $\theta_4$ may be shifted in relative to the central axis 201 of the FOV $\theta_2$ in FIG. 2B.

In an embodiment, a position of the opening OP41 and/or a position of the opening OP 42 is set in relative to a position of the ALS 463b such that the FOV $\theta_4$ of the ALS 463b is inclined toward the edge of OLED display panel 400. The position of the opening OP41 may be set by appropriately setting positions of the BM regions 431 and 433 of the BM layer 432, and the position of the opening OP42 is set by appropriately setting positions of the metal electrodes 441 and 443 in the touch sensing layer 440. The opening OP41 in the color filter layer 430 in FIG. 4 may have a shift in relative to the opening OP21 shown in FIG. 2B, and the opening OP42 in the touch sensing layer 440 in FIG. 4 may have a shift in relative to the opening OP22 shown in FIG. 2B.

Referring to FIG. 2B and FIG. 4, the BM regions 431 and 433 of the BM layer 432 and the metal electrodes 441 and 443 of the touch sensing layer 440 are designed such that the FOV $\theta_4$ of the ALS 463b in FIG. 4 is greater than the FOV $\theta_2$ of the ALS 263b in FIG. 2B. In an embodiment, at least one of the width W41 of the opening OP41 and the width W42 of the opening OP 42 in FIG. 4 is larger than the respective width W21 of the opening OP21 and the width W22 of the opening OP22 in FIG. 2B. The ALS 463b with the FOV $\theta_4$ may sense the light from the edge of the OLED display panel 400 more efficiently.

It is appreciated that an adjustment amount of the FOV (i.e., a difference between the FOV $\theta_2$ and the FOV $\theta_4$) of the ALS 463b are determined according to design requirements. Additionally, the disclosure does not intend to limit the opening to be adjusted. For example, in an embodiment, the widths W41 and W42 of both the openings OP41 and OP42 in FIG. 4 are different from the respective widths W21 and W22 of the openings OP21 and OP22 in FIG. 2B.

In another embodiment, only one of the widths W41 and W42 of the openings OP41 and OP42 in FIG. 4 is different from the respective widths W21 and W22 of openings OP21 and OP22 in FIG. 2B.

Figure 5:
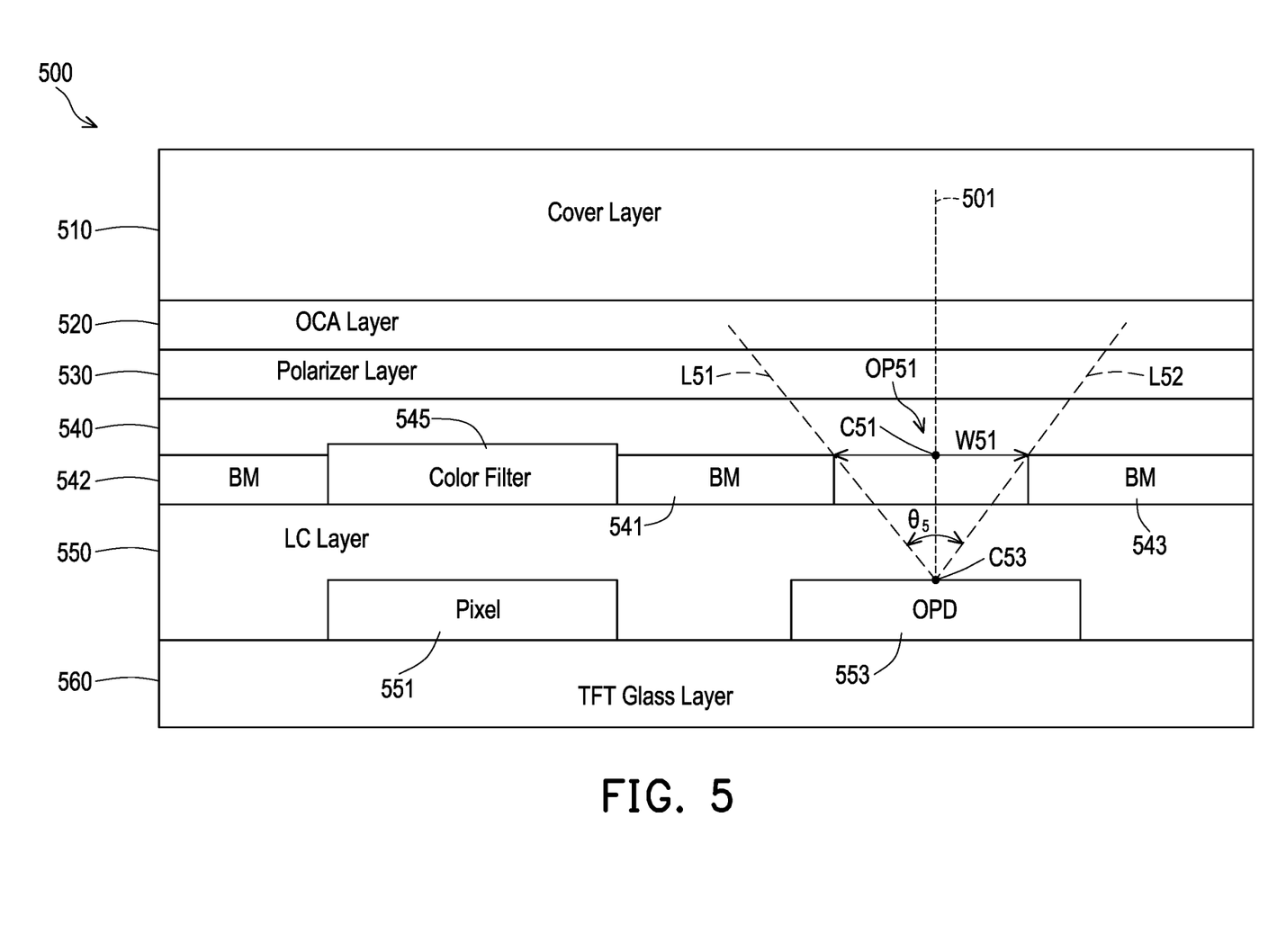
FIG. 5 illustrates a cross-sectional view of a LCD panel including an ambient light sensor in accordance with some embodiment

FIG. 5 illustrates a cross-sectional view of an LCD display panel 500 including an ALS 553 in accordance with an embodiment. The LCD display panel 500 may include a cover layer 510, an OCA layer 520, a polarizer layer 530, a color filter layer 540, a liquid crystal layer 440 and a thin-film transistor (TFT) glass layer 560. The cover layer 510 is designed to provide protection to the LCD display panel 500, and the OCA layer 520 is designed to bond the cover layer 510 and the polarizer layer 530. The cover layer 510 and the OCA layer 520 may be similar to the cover layer 210 and the OCA layer 220 illustrated in FIG. 2A, thus the detailed description of the cover layer 510 and the OCA layer 520 are omitted hereafter. The polarizer layer 530 is disposed below the OCA layer 520, and the polarizer layer 530 is configured to polarize the light which is emitted from the backlight module (not shown in the figure) of the LCD display panel 500 so as to properly display image data on the LCD display panel 500. The disclosure does not intend to limit types, materials, thickness of the polarizer layer 530.

The color filter layer 540 may include a black matrix (BM) layer 542 that has a plurality of BM regions, a color filter region 545, and an opening OP51. Each of the color filter region 545 and the opening OP51 is formed between two BM regions of the BM layer 542. As shown in FIG. 5, the opening OP51 is formed between BM regions 541 and 543 of the BM layer 542. The BM regions of the BM layer 542 may be made of light shielding materials that are designed to shield light passing through the BM regions and to separate red, green and blue color filters. In an embodiment, the color filter region 545 corresponds to the LCD element 551 of the LCD display panel 500, and the color filter region 545 may partially or completely overlap the LCD element 551 (which is denoted as pixel in FIG. 5) that are disposed beneath the color filter region 545. The LCD element 551 represents a liquid crystal cell. In an embodiment, the opening OP51 is designed to allow light reflected from a finger touching a surface of the LCD display panel 500 to pass through the opening OP51 to an ALS 553 disposed beneath the opening OP51. A width W51 of the opening OP51 and a central point C51 of the opening OP51 may be adjusted by setting positions of the BM regions 541 and 543. The FOV $\theta_5$ of the ALS 553 may be larger as the width W51 of the opening OP51 is larger, and vice versa.

The LC layer 550 may include the LCD element 551 and the ALS 553. The ALS 553 may include a photosensitive element that is configured to sense ambient light of the surrounding environment of the LCD display panel 500. The ALS 553 may have a central point C53 and the FOV of $\theta_5$ which is an angle between the light rays L51 and L52. The TFT glass layer 560 may include driving circuits or driving electrodes for driving the LCD element 551 and the ALS 553 in the LC layer 550.

Figure 6:
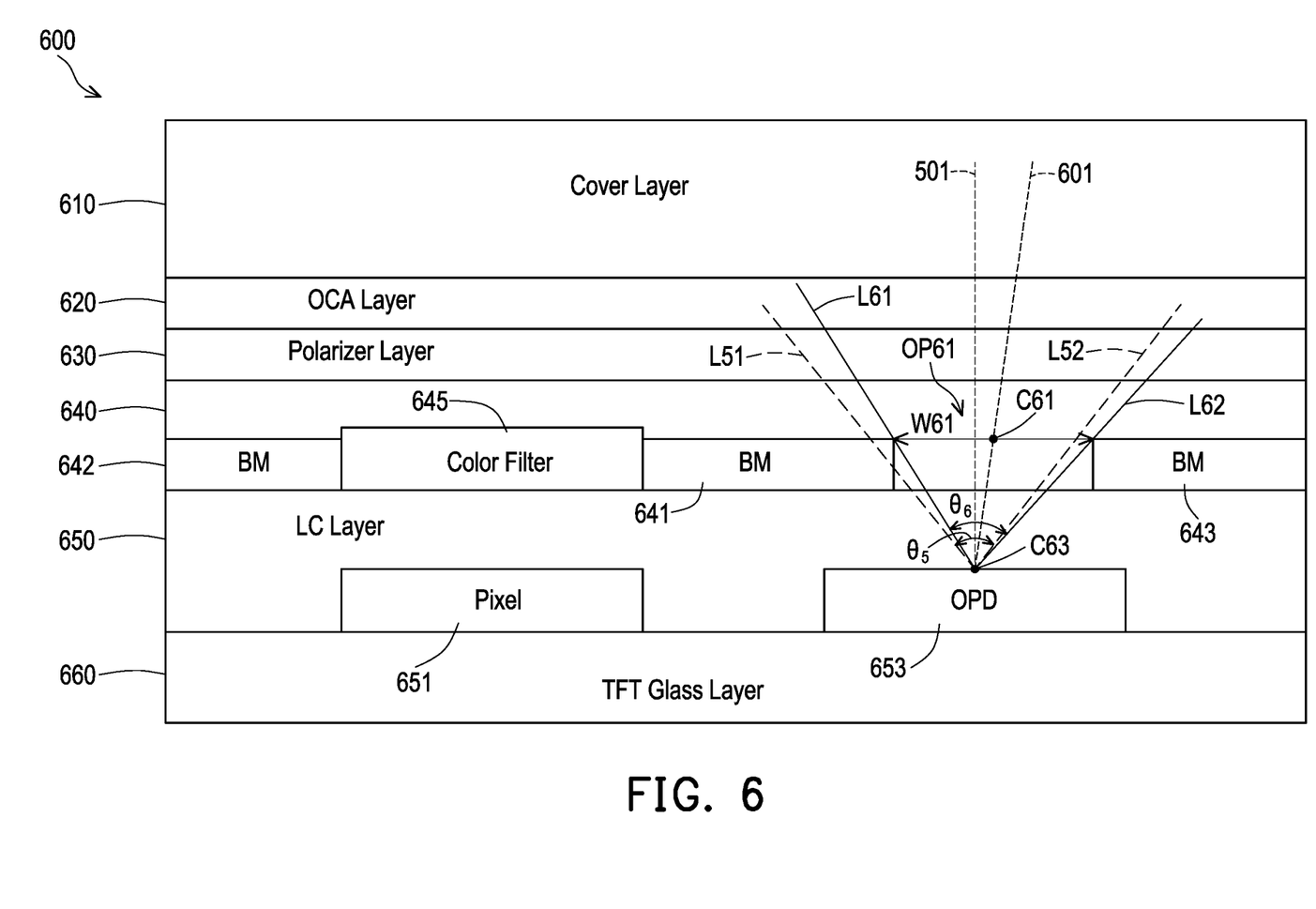
FIG. 6 and FIG. 7 illustrate an incline of the FOV of an ambient light sensor in a LCD panel in accordance with some embodiments.

FIG. 6 illustrates an incline of the FOV $\theta_6$ of the ALS 653 to an edge of an LCD display panel 600 in accordance with an embodiment. The elements 610 through 660, 645, 651 and 653 of the LCD display panel 600 in FIG. 6 are similar to elements 510 through 560, 545, 551 and 553 of the LCD display panel 500 in FIG. 5, thus the detailed description of these elements in FIG. 6 is omitted hereafter. In FIG. 6, the color filter layer 640 includes an opening OP61 that is formed between BM regions 641 and 643 of the BM layer 642. The opening OP61 of the color filter layer 640 has a central point C61 and a width of W61. The FOV $\theta_5$ may refer to an angle between the light rays L51 and L52 as illustrated in FIG. 5, and the FOV $\theta_6$ may refer to an angle between the light rays L61 and L62. The central axis 601 of the FOV $\theta_6$ in FIG. 6 may go through the central point C63 of the ALS 653 and the central point C61 of the opening OP61, and the central axis 501 of the FOV $\theta_5$ in FIG. 5 may go through the central point C53 of the ALS 553 and the central point C51 of the opening OP51.

In FIG. 6, compared to the FOV $\theta_5$, the FOV $\theta_6$ of the ALS 653 is inclined toward an edge of the LCD display panel 600. The incline of the FOV $\theta_6$ of the ALS 653 in FIG. 6 is similar to the incline of the ALS 363b in FIG. 3, thus the detailed description about the incline of the FOV $\theta_6$ of the ALS 653 in FIG. 6 is omitted hereafter. Referring to FIG. 5 and FIG. 6, by appropriately setting the positions of the BM regions 641 and 643 in the BM layer 642, it is possible to change the FOV of the ALS 653 from $\theta_5$ to $\theta_6$ and to shift the central axis 501 of the FOV $\theta_5$ to the central axis 601 of the FOV $\theta_6$. It is appreciated that a direction and an amount of the incline of the FOV $\theta_6$ of the ALS 653 compared to the FOV $\theta_5$ of the ALS 553 are determined according to design requirements. Based on that the FOV $\theta_6$ and the FOV $\theta_5$ may have the same absolute angle, the width W61 may be larger than the width W51. In another embodiment, if the width W61 is kept same as the width W51, the FOV $\theta_6$ in FIG. 6 may be smaller than the FOV $\theta_5$ in FIG. 5. Since the FOV of the ALS 653 is inclined toward the edge of the LCD display panel 600, the interferences of the functions of the LCD display panel (i.e., display function or fingerprint sensing function) to the ambient light sensing operation of the ALS 653 is reduced, and the accuracy of the ambient light sensing function of the LCD display panel 600 is improved.

Figure 7:
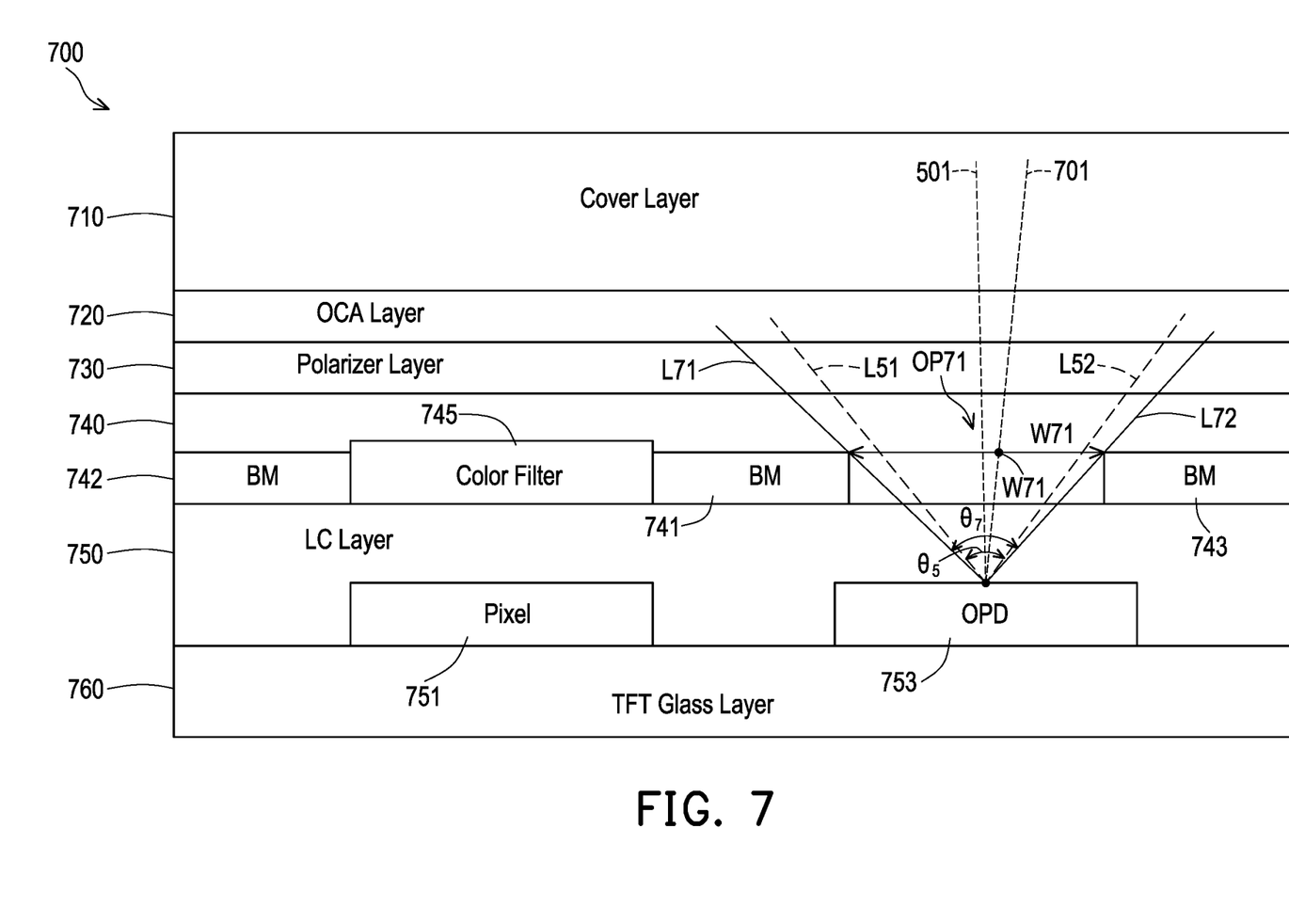

FIG. 7 illustrates an incline of the FOV $\theta_7$ of the ALS 753 $\theta_7$ to an edge of an LCD display panel 700 in accordance with an embodiment. The elements 710 through 760, 745, 751 and 753 of the LCD display panel 700 in FIG. 7 are similar to elements 510 through 560, 545, 551 and 553 of the LCD display panel 500 in FIG. 5, thus the detailed description of these elements in FIG. 7 is omitted hereafter. The FOV $\theta_7$ may refer to an angle between the light rays L71 and L72. The color filter layer 740 may include an opening OP71 that is formed between BM regions 741 and 743 of the BM layer 742, and the opening OP71 of the color filter layer 740 has a central point C71 and a width W71. Referring to FIG. 5 and FIG. 7, the central point C71 of the opening OP71 may be shifted in relative to the central point C51 of the opening OP51 in FIG. 5, and a central axis 701 of the of the FOV $\theta_7$ may be may be inclined in relative to the central axis 501 of the FOV $\theta_5$.

Figure 8A:
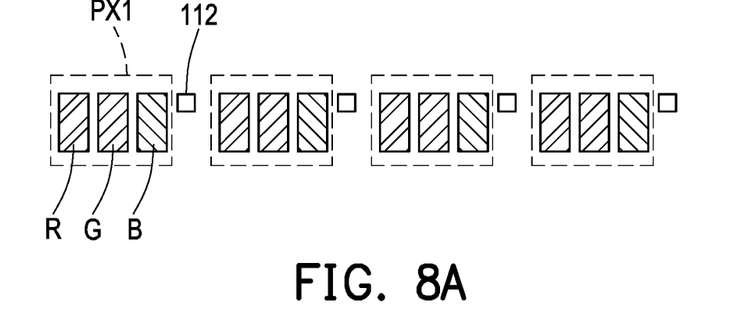
FIG. 8A illustrates a layout diagram of display pixels and fingerprint sensors of a display panel in accordance with an embodiment.

Referring to FIG. 5 and FIG. 7, the BM regions 741 and 743 of the BM layer 452 are designed such that the width W71 of the opening OP71 is larger than the width W51 of the opening OP51 in FIG. 5, and the FOV $\theta_7$ of the ALS 753 is greater than the FOV $\theta_5$ of the ALS 553. In this way, the ALS 753 with the FOV $\theta_7$ may sense the ambient light from the edge of the LCD display panel 700 more efficiently. It is appreciated that an adjustment amount of the FOV (i.e., a difference between the FOV $\theta_5$ and the FOV $\theta_7$) are determined according to design requirements FIG. 8A illustrates a layout diagram of display pixels PX1 and fingerprint sensors 112 of a display panel in accordance with an embodiment. Each display pixel PX1 includes red, green and blue subpixels R, G, B; and the display pixels PX1 and the fingerprint sensors 112 may be disposed in the region R1 of the active area 120 of the display panel 100 in FIG. 1. One or more display pixels PX1 may corresponds to one fingerprint sensor 112 depending on design requirements (i.e., requirements related to the fingerprint sensing resolution). In an embodiment, each display pixel PX1 corresponds to one fingerprint sensor 112, and the display pixel PX1 is arranged next to the corresponding fingerprint sensor 112. In an alternative embodiment, every two or more display pixels PX1 corresponds to one display pixel PX1, and every two or more display pixels PX1 are arranged next to the corresponding the fingerprint sensor 112.

Figure 8B:
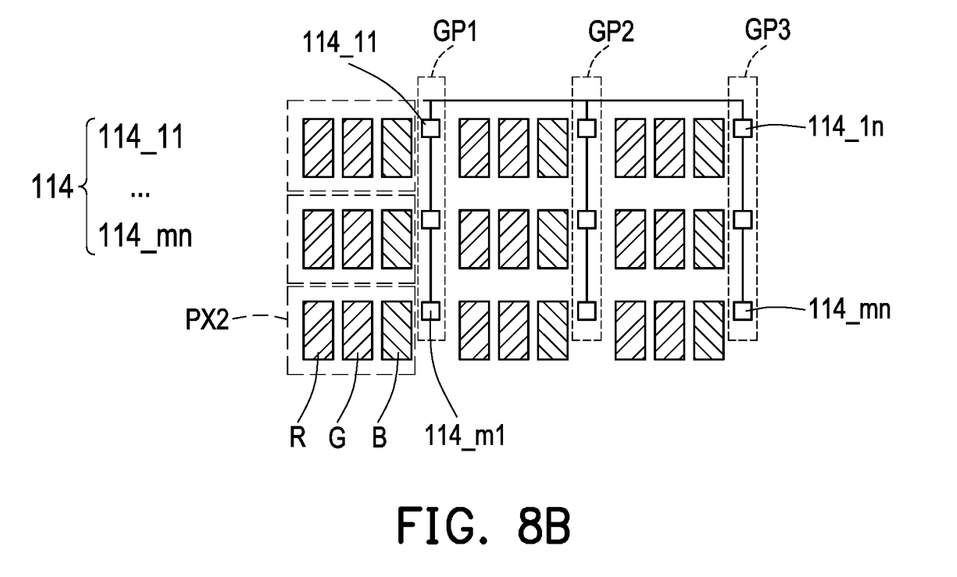
FIG. 8B illustrates a layout diagram of display pixels and ambient light sensors of a display panel in accordance with an embodiment.

FIG. 8B illustrates a layout diagram of display pixels PX2 and ALSs 114 in accordance with an embodiment. Each display pixel PX2 includes red, green and blue subpixels R, G, B, and each ALS 114 may include a plurality of sensing elements 114_11 to 114_mn, in which m and n are positive integers. The display pixels PX2 and the ALSs 114 may be disposed in the region R2 of the active area 120 of the display panel 100 in FIG. 1. One or more display pixels PX1 may corresponds to one of the sensing elements 114_11 to 114_mn depending on design requirements. In an embodiment, each display pixel PX2 corresponds to one of the sensing elements 114_11 to 114_mn, and each display pixel PX2 is arranged next to the corresponding the sensing elements 114_11 to 114_mn. In an alternative embodiment, every two or more display pixels PX2 correspond to one of the sensing elements 114_11 to 114_mn, and the every two or more display pixels PX2 are arranged next to the corresponding one of the sensing elements 114_11 to 114_mn.

Referring to FIG. 8A and FIG. 8B, the number of the fingerprint sensors 112 in the display panel may lead to a higher resolution than the ALS 114, the ALS 114 may capture a wider range of light intensities than the fingerprint sensor 112, and the fingerprint sensor 112 may have a smaller occupied area than the ALS 114. In an embodiment, the sensing elements 114_11 to 114_mn of the ALS 114 are divided into groups GP1, GP2 and GP3, in which each of the groups GP1, GP2 and GP3 includes a plurality of sensing elements connected to each other in series. For example, the group GP1 includes sensing elements 114_11 to 114_m1 that are coupled to each other in series, and the group GP3 includes sensing elements 114_1n to 114_mn that are coupled to each other in series. The sensing elements in each group may be connected to each other in series along a column direction of the memory array, but the disclosure is not limited thereto. Additionally, the groups GP1, GP2 and GP3 are coupled to each other in parallel. In other words, the sensing elements 114_11 to 114_m1 of the ALS 114 are connected in serial-parallel manner to form a single ALS

114. Each of the ALS 114 are formed by combining the sensing elements 114_11 to 114_mn disposed in a plurality of display pixels PX2.

In an embodiment, an occupied area of each of the sensing elements 114_11 to 114_m1 of the ALS 114 is same as an occupied area of one fingerprint sensor 112. In this way, the fingerprint sensor 112 and the ALS 114 may be manufactured using same manufacturing processes, thus reducing manufacturing cost and simplifying the manufacturing processes of the display panel.

In summary, both of fingerprint sensors and ambient light sensors are disposed in an active area of an in-cell optical sensing display panel. In addition, the display panel is designed such that a field of view (FOV) of the ambient light sensors are inclined toward an edge of the in-cell optical sensing display panel to sense more amount of ambient light. In this way, the ambient light sensors may sense the ambient light more efficiently, and an interference of operations of the in-cell optical sensing display panel to the ambient light sensing operation is reduced. Furthermore, an occupied area of each of sensing elements of an ambient light sensor is same as an occupied area of one fingerprint sensor. As such, a same manufacturing processes of the display panel is simplified and the manufacturing cost of the display panel is reduced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An in-cell optical sensing display panel, comprising:
   a pixel array disposed in an active area of the in-cell optical sensing display panel, wherein the active area comprises a first region and a second region, and the second region surrounds the first region;
   a sensor array, disposed in the first region of the active area, comprising a plurality of first optical sensors and configured to sense a fingerprint of a finger touching a surface of the in-cell optical sensing display panel; and
   a plurality of second optical sensors, disposed in the second region of the active area and configured to sense ambient light and not to be used for fingerprint sensing.

2. The in-cell optical sensing display panel of claim 1, wherein each of the second optical sensors comprises a plurality of sensing elements, and an occupied area of each of the plurality of sensing elements is same as an occupied area of one of the first optical sensors.

3. The in-cell optical sensing display panel of claim 2, wherein
   the sensing elements are divided into a plurality of sensing groups electrically connected to each other in parallel, and
   sensing elements in each of the sensing groups are electrically connected to each other in series.

4. The in-cell optical sensing display panel of claim 1, further comprising:
   a non-active area where no display pixel is disposed and no second optical sensor is disposed.

5. The in-cell optical sensing display panel of claim 1, further comprising:
   an optical sensing layer, comprising the first optical sensors and the second optical sensors; and
   a black matrix layer, comprising a plurality of first openings and a plurality of second openings, wherein each of the first openings corresponds to a corresponding one of the first optical sensors and overlaps an area of the corresponding one of the first optical sensors, each of the second openings corresponds to a corresponding one of the second optical sensors and overlaps an area of the corresponding one of the second optical sensors, and a width of each of the second openings is greater than a width of each of the first openings.

6. The in-cell optical sensing display panel of claim 5, further comprising:
   a touch sensing layer, comprising a plurality of third openings and a plurality of fourth openings, wherein the third openings overlap the first openings, and the fourth openings overlap the second openings, and
   a width of each of the fourth openings is greater than a width of each of the third openings.

7. The in-cell optical sensing display panel of claim 1, further comprising:
   an optical sensing layer, comprising the first optical sensors and the second optical sensors; and
   a black matrix layer, comprising a plurality of first openings and a plurality of second openings, wherein each of the first openings overlaps an area of a corresponding one of the first optical sensors, and each of the second openings overlaps an area of a corresponding one of the second optical sensors,
   wherein a horizontal distance between a central point of each of the second openings and a central point of the area of the corresponding one of the second optical sensors is greater than a horizontal distance between a central point of the each of the first openings and a central point of the area of the corresponding one of the first optical sensors.

8. The in-cell optical sensing display panel of claim 7, further comprising:
   a touch sensing layer, comprising a plurality of third openings and a plurality of fourth openings, wherein the third openings overlap the first openings, and the fourth openings overlap the second openings, and
   wherein a horizontal distance between a central point of each of the fourth openings and a central point of the area of the corresponding one of the second optical sensors is greater than a horizontal distance between a central point of the each of the third openings and a central point of the area of the corresponding one of the first optical sensors.

9. The in-cell optical sensing display panel of claim 1, further comprising:
   an optical sensing layer, comprising the first optical sensors and the second optical sensors; and
   a black matrix layer, comprising a plurality of first openings and a plurality of second openings, wherein each of the first openings overlaps an area of a corresponding one of the first optical sensors, and each of the second openings overlaps an area of a corresponding one of the second optical sensors, and
   wherein a position of each of the second openings is relative to a position of each of the corresponding one of the second optical sensors, such that a field of view of the corresponding one of the second optical sensors is inclined toward an edge of the in-cell optical sensing display panel.

10. The in-cell optical sensing display panel of claim 9, further comprising:
    a touch sensing layer, comprising a plurality of third openings and a plurality of fourth openings, wherein the third openings overlap the first openings, and the fourth openings overlap the second openings, and wherein a position of each of the fourth opening is relative to a position of each of the corresponding one of the second optical sensors, such that a field of view of the corresponding one of the second optical sensors is inclined toward an edge of the in-cell optical sensing display panel.

11. The in-cell optical sensing display panel of claim 1, wherein the in-cell optical sensing display panel is a liquid crystal display (LCD) panel.

12. The in-cell optical sensing display panel of claim 1, wherein the in-cell optical sensing display panel is an organic light-emitting diode (OLED) panel.

* * * * *